US012745537B2

(12) United States Patent
Wu et al.

(10) Patent No.: US 12,745,537 B2
(45) Date of Patent: Sep. 22, 2026

(54) DISPLAY DEVICE

(71) Applicant: InnoLux Corporation, Miao-Li County (TW)

(72) Inventors: Ching-Neng Wu, Miao-Li County (TW); Yu-Ti Huang, Miao-Li County (TW); Li-Wei Sung, Miao-Li County (TW); Kuei-Chen Chiu, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 622 days.

(21) Appl. No.: 18/189,366

(22) Filed: Mar. 24, 2023

(65) Prior Publication Data

US 2023/0354673 A1 Nov. 2, 2023

(30) Foreign Application Priority Data

Apr. 29, 2022 (CN) ......................... 202210472406.4

(51) Int. Cl.
*H10K 59/80* (2023.01)
*H10H 20/857* (2025.01)
*H10W 90/00* (2026.01)

(52) U.S. Cl.
CPC ..... *H10K 59/80515* (2023.02); *H10H 20/857* (2025.01); *H10W 90/00* (2026.01)

(58) Field of Classification Search
CPC .................... H10K 59/80515; G02F 1/133707
See application file for complete search history.

(56) References Cited

U.S. PATENT DOCUMENTS 11,194,207 B2 12/2021 Yamazaki et al.
2010/0157228 A1 6/2010 Sakurai
2010/0207857 A1* 8/2010 Gu .................... G02F 1/134363 345/88
2011/0025935 A1* 2/2011 Oka .................. C09K 19/0258 349/33

(Continued)

FOREIGN PATENT DOCUMENTS

CN 1690815 A 11/2005
CN 101339342 A 1/2009

(Continued)

OTHER PUBLICATIONS

Office Action dated Apr. 22, 2025, issued in application No. EP 23166001.0.

(Continued)

*Primary Examiner* — Eric K Ashbahian
(74) *Attorney, Agent, or Firm* — McClure, Qualey & Rodack, LLP

(57) ABSTRACT

A display device is provided. The display device includes a display panel. The display panel includes a plurality of pixel electrodes. One of the plurality of pixel electrodes includes a first finger portion, a second finger portion, and a third finger portion. The first finger portion, the second finger portion, and the third finger portion are disposed on the same layer. The second finger portion is disposed between the first finger portion and the third finger portion. The first pitch between the first finger portion and the second finger portion is different from the second pitch between the second finger portion and the third finger portion.

12 Claims, 10 Drawing Sheets

(56) References Cited

U.S. PATENT DOCUMENTS

| | | | | |
|---|---|---|---|---|
| 2013/0235315 | A1 | 9/2013 | Ito et al. | |
| 2014/0092353 | A1* | 4/2014 | Matsushima | G02F 1/136286 349/110 |
| 2014/0152934 | A1* | 6/2014 | Huh | G02F 1/133784 349/139 |
| 2015/0098039 | A1 | 4/2015 | Park et al. | |
| 2016/0187684 | A1* | 6/2016 | Zhang | G02F 1/134363 257/773 |
| 2020/0050063 | A1 | 2/2020 | Yoshida | |
| 2020/0271997 | A1* | 8/2020 | Nakagawa | G02F 1/134309 |
| 2022/0035207 | A1* | 2/2022 | Meng | G02F 1/134345 |

FOREIGN PATENT DOCUMENTS

| | | | |
|---|---|---|---|
| CN | 110168438 | A | 8/2019 |
| EP | 2520972 | A2 | 11/2012 |

OTHER PUBLICATIONS

Extended European Search Report dated Sep. 19, 2023, issued in application No. EP 23166001.0.

* cited by examiner

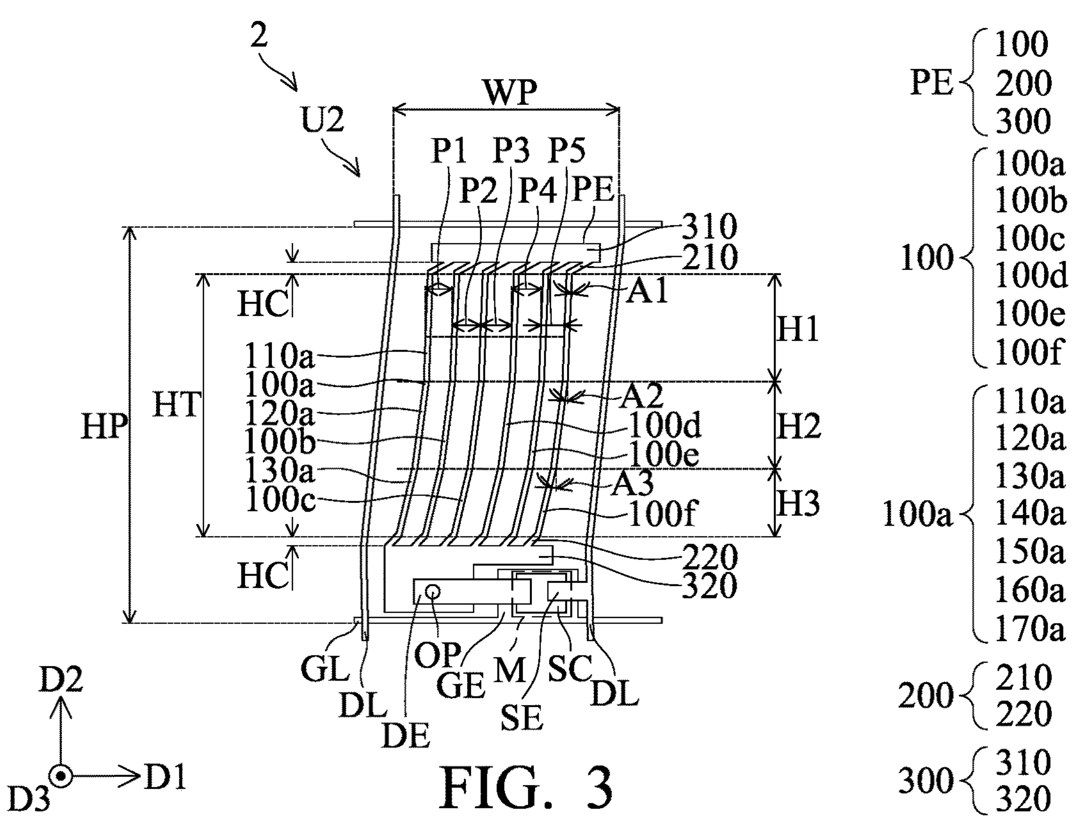
FIG. 3
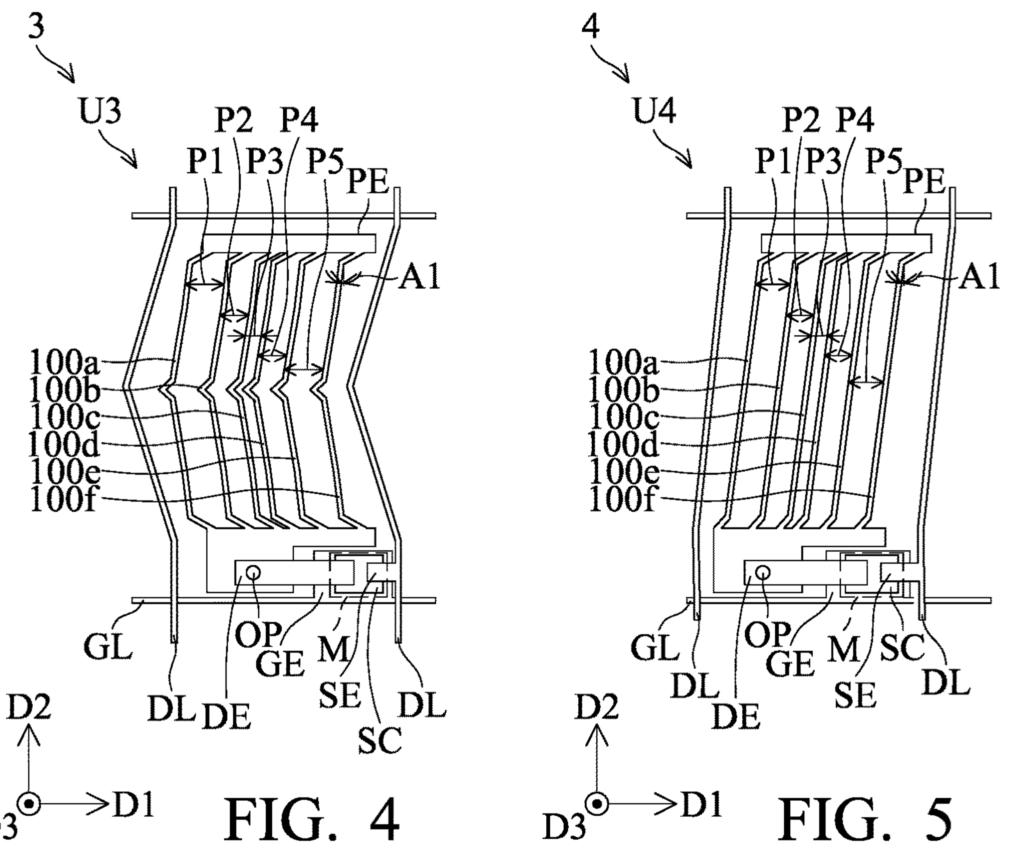
FIG. 4
FIG. 5

DISPLAY DEVICE

CROSS REFERENCE TO RELATED APPLICATIONS

This application claims the priority of China Patent Application No. 202210472406.4, filed on Apr. 29, 2022, the entirety of which is incorporated by reference herein.

TECHNICAL FIELD

The present disclosure relates to a display device, in particular to a display device in which the structure of each pixel electrode of a plurality of pixel electrodes is different.

BACKGROUND

The display device includes a display panel capable of displaying images, so the display device can be widely used in consumer electronics products. In order to provide consumers with a good user experience, it is necessary to increase the display capabilities of the display panel. For example, the uniformity of light emitted from the display panel should be improved and the surface reflection of the display panel should be decreased.

When the current display panel is irradiated with an external light source, if the display panel is in an unlit state (that is, when the power is not turned on), a periodic rainbow-like pattern will be observed on the surface of the display panel. The periodic rainbow-like pattern is caused by the reflection of an external light source on the surface of the display panel. Therefore, there are still some problems to be overcome with respect to the display device.

SUMMARY

In some embodiments, a display device is provided. The display device includes a display panel. The display panel includes a plurality of pixel electrodes. One of the plurality of pixel electrodes includes a first finger portion, a second finger portion, and a third finger portion. The first finger portion, the second finger portion, and the third finger portion are disposed on the same layer. The second finger portion is disposed between the first finger portion and the third finger portion. The first pitch between the first finger portion and the second finger portion is different from the second pitch between the second finger portion and the third finger portion.

In some embodiments, a display device is provided. The display device includes a display panel. The display panel includes a plurality of pixel electrodes. One of the plurality of pixel electrodes includes a first finger portion, a first finger portion includes a first linear portion, a second linear portion, and a third linear portion. The second linear portion connects the first linear portion and the third linear portion. The first linear portion has a first deviation angle, the second linear portion has a second deviation angle, and the third linear portion has a third deviation angle. The first deviation angle, the second deviation angle, and the third deviation angle have a first increasing tendency.

In some embodiments, a display device is provided. The display device includes a display panel. The display panel includes a plurality of pixel electrodes. The plurality of pixel electrodes includes a first pixel electrode and a second pixel electrode. The second pixel electrode is adjacent to or does not be adjacent to the first pixel electrode. Wherein the structure of the first pixel electrode is different from the structure of the second pixel electrode.

The display device of the present disclosure may be applied in various types of electronic devices including display panels. In order to make the features and advantages of some embodiments of the present disclosure more understand, some embodiments of the present disclosure are listed below in conjunction with the accompanying drawings, and are described in detail as follows.

BRIEF DESCRIPTION OF THE DRAWINGS

Through the following detailed description and the accompanying drawings, a person of ordinary skill in the art will better understand the viewpoints of some embodiments of the present disclosure. It should be noted that, in accordance with standard practice in the industry, various features are not drawn to scale and are used for illustration purposes. In fact, the dimensions of the various features may be arbitrarily increased or reduced for clarity of discussion.

FIG. 3 to FIG. 15 are schematic top views of display devices according to some embodiments of the present disclosure, respectively.

DETAILED DESCRIPTION

Figure 1:
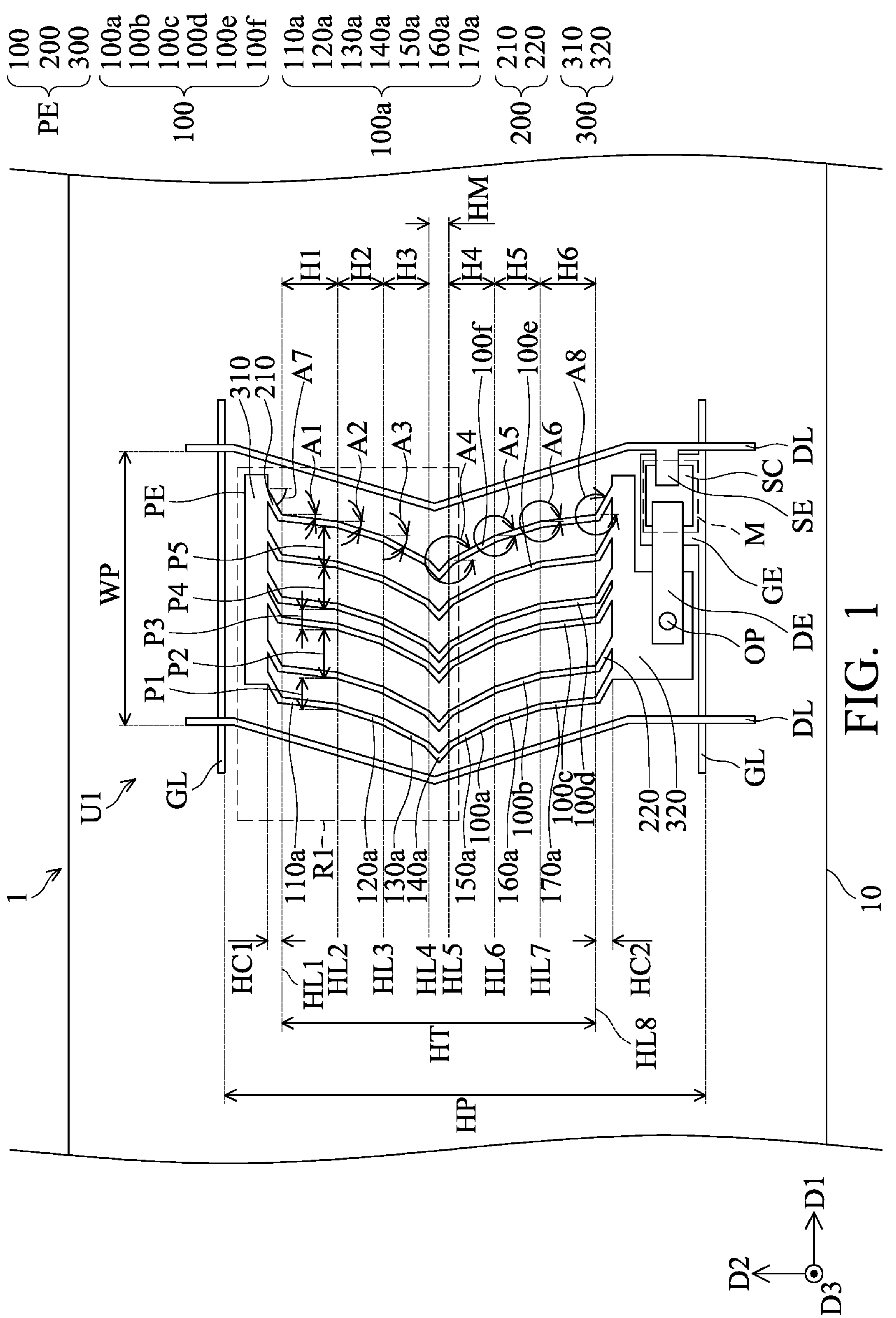
FIG. 1 is a schematic top view showing a partial region of display device according to some embodiments of the present disclosure.

The following disclosure provides many different embodiments or examples for implementing different features of the display device disclosed herein. Specific examples of each feature and its configuration are described below to simplify the embodiments of the present disclosure. Naturally, these are not intended to limit the present disclosure. For example, if the description mentions that the first feature is formed on the second element, it may include an embodiment in which the first feature and second feature are in direct contact, or may include an embodiment in which additional feature is formed between the first feature and the second feature thereby the first feature and the second feature do not directly contact. In addition, the present disclosure may repeat reference numerals and/or letters in different embodiments or examples. Such repetition is for conciseness and clarity, and is not used to indicate the relationship between the different embodiments and/or examples discussed herein.

The spatial terms mentioned herein, such as “upper”, “lower”, “left”, “right”, and the like, are directions with reference to the drawings. Therefore, the spatial terms are used to illustrate, but not to limit the present disclosure.

In some embodiments of the present disclosure, terms related to disposing and connecting, such as “dispose”, “connect”, and the like, unless specifically defined, may refer that two components are in direct contact, or may also refer that two components are not in direct contact wherein another component is disposed between the two structures. The terms related to disposing and connecting may also include the embodiments where both components are movable or both components are fixed.

In addition, the “first”, “second”, and the like mentioned in the specification or claims are used to name different components or distinguish different embodiments or scopes and are not used to limit the upper limit or lower limit of the number of the components and are not used to limit the manufacturing order or the arrangement order of the components.

Herein, the terms "about", "substantially", and the like usually mean within 10% of a given value or a given range, for example, within 10%, within 5%, within 3%, within 2%, within 1%, or within 0.5%. The given value herein is an approximate value, that is, without specific description of "about", "substantially", and the like, the meanings of the terms may still be implied.

Unless otherwise defined, all terms (including technical and scientific terms) used herein have the same meaning as commonly understood by the person of ordinary skills in art of the present disclosure. It may be understood that these terms, such as those defined in commonly used dictionaries, should be interpreted as having meanings consistent with the background or context of the related technology and the present disclosure, and should not be interpreted in an idealized or overly formal manner, unless otherwise specified in the embodiments of the present disclosure.

Some modifications of the embodiment are described below. In the different drawings and illustrated embodiments, similar reference numerals are used to designate similar features. It should be understood that additional operations may be provided before, during, and after the method, and some of the operations that are described may be deleted or replaced with other embodiments of the method.

Herein, directions are not limited to three axes of a rectangular coordinate system, such as the X-axis, Y-axis, and Z-axe, and may be interpreted in a broader sense. For example, the X-axis, the Y-axis, and the Z-axis may be perpendicular to one another, or may represent different directions that are not perpendicular to one another, but the present disclosure is not limited thereto. For convenience of description, hereinafter, the X-axis direction is a first direction D1 (width direction), the Y-axis direction is the second direction D2 (height direction), and the Z-axis direction is the third direction D3 (thickness direction). In some embodiments, the schematic top view described herein is a schematic view of observing the XY plane.

In the present disclosure, the electronic device may include a display device, a backlight device, an antenna device, a sensing device, or a titling device, but the present disclosure is not limited thereto. The electronic device may be a foldable or flexible electronic device. The display device may be a non-self-luminous display device or a self-luminous display device. The antenna device may be a liquid crystal antenna device or a non-liquid crystal antenna device. The sensing device may be a sensing device for sensing capacitance, light, heat, or ultrasonic waves, but the present disclosure is not limited thereto. The electronic elements may include passive elements and active elements, such as capacitors, resistors, inductors, diodes, transistors, and the like. The diodes may include light-emitting diodes or photodiodes. The light-emitting diodes may include, for example, organic light-emitting diodes (OLEDs), mini light-emitting diodes (mini LEDs), micro light-emitting diodes (micro LEDs), or quantum dot light-emitting diodes (quantum dot LED), but the present disclosure is not limited thereto. The titling device may be, for example, a display titling device or an antenna titling device, but the present disclosure is not limited thereto. It should be noted that, the electronic device may be any arrangement and combination of the foregoing, but the present disclosure is not limited thereto. The present disclosure will be described below with reference to a display device as the electronic device or titling device, but the present disclosure is not limited thereto.

In addition, the shape of the electronic device may be rectangular, circular, polygonal, a shape with curved edges, or another suitable shape. The electronic device may have a peripheral system, such as a processing system, a driving system, a control system, a light source system, a shelf system, and the like to support the display device or titling device. It should be noted that the electronic device may be any arrangement and combination of the foregoing, but the present disclosure is not limited thereto.

Referring to FIG. 1, it shows a schematic top view of a partial region of a display device 1 according to some embodiments of the present disclosure. It should be understood that, for the sake of clarity, some components of the display device 1 are omitted in the drawings, and some components are schematically shown. In some embodiments, additional components may be added to the display device 1 described below. In other embodiments, some components of the display device 1 described below may be replaced or omitted. It should be understood that, in some embodiments, additional steps may be provided before, during, and/or after the method of manufacturing the display device. In some embodiments, some of the described steps may be replaced or omitted, and the order of some of the described steps may be interchangeable.

As shown in FIG. 1, in some embodiments, the display device 1 may include a display panel 10. The display panel 10 may include a substrate (not shown), various elements disposed on the substrate, and various film layers covering the substrate. For the convenience of description, hereinafter, each element disposed on the substrate, such as gate lines, data lines, pixel electrodes, and the like, will be described in detail, and the description of the substrate will be omitted.

As shown in FIG. 1, the display panel 10 may include a plurality of gate lines (scanning lines) GL and a plurality of data lines DL on the substrate, the plurality of data lines DL across the plurality of gate lines GL. Each of the plurality of gate lines GL may extend along the first direction D1. At least a portion of each of the plurality of data lines DL may extend along the second direction D2, and the first direction D1 is different from the second direction D2. For example, in some embodiments, the first direction D1 is perpendicular to the second direction D2, but the present disclosure is not limited thereto. In some embodiments, the extended shape of the data line DL may correspond to the extended shape of the pixel electrode PE described later. For example, in some embodiments, the data line DL may include a portion extending along the second direction D2 and another portion extending along a direction having an included angle with the second direction D2, but the present disclosure is not limited thereto. In some embodiments, a portion of the gate line GL and the data line DL are substantially perpendicular or orthogonal.

In some embodiments, the plurality of gate lines GL and the plurality of data lines DL intersect with each other to define a plurality of sub-pixel units U1. In some embodiments, the sub-pixel unit U1 may have a pixel unit width WP and a pixel unit height HP. In some embodiments, the pixel unit width WP may be defined according to adjacent (two) data lines DL. In some embodiments, the pixel unit width WP is a distance in the first direction D1, wherein the distance is from a left boundary of one of the adjacent data lines DL to a left boundary of the other one of the adjacent data lines DL which is closest to the one data line DL along the first direction D1. For example, according to design requirements such as panel size and resolution, the pixel unit width WP may be greater than or equal to 10 microns (μm) and less than or equal to 200 microns (10 μm≤pixel unit width≤200 μm). In some embodiments, the pixel unit height HP may be defined according to adjacent (two) gate lines GL. In some embodiments, the pixel unit height HP is a distance in the second direction D2, wherein the distance is from a lower boundary of one of the adjacent gate lines GL to a lower boundary of the other one of the adjacent gate lines GL which is closest to the one gate line GL along the second direction D2. For example, according to design requirements such as panel size and resolution, the pixel unit height HP may be greater than or equal to 30 microns and less than or equal to 600 microns (30 μm≤pixel unit height≤600 μm).

In some embodiments, for ease of illustration, one or two sub-pixel units U1 are shown, but the present disclosure is not limited thereto. In other embodiments, according to the display requirements of the display panel 10, the display panel 10 may include a plurality of sub-pixel units U1 in the active region. A plurality of sub-pixel units U1 may be arranged in an array. In some embodiments, the sub-pixel unit U1 may be a red sub-pixel unit, a green sub-pixel unit, or a blue sub-pixel unit, and a portion of the plurality of sub-pixel units U1 (some of the sub-pixel units U1) (for example, three sub-pixel units) may be regarded as a pixel unit, but the present disclosure is not limited thereto. According to the light emission requirement of the pixel unit, the arrangements and types of the sub-pixel units U1 may be adjusted. In some embodiments, the size of adjacent sub-pixel units U1 may be the same or different.

In some embodiments, each of the plurality of sub-pixel units U1 may include a transistor M. The transistor M may be a switching transistor. In some embodiments, the data line DL may provide a data signal to the sub-pixel unit U1 through the transistor M. Also, the gate line GL may provide a scanning pulse signal to the sub-pixel unit U1 and control the sub-pixel unit U1 by cooperating with the transistor M together. In some embodiments, the transistor M includes a semiconductor layer SC, a source electrode SE, a drain electrode DE, and a gate electrode GE. The gate electrode GE may be a portion of the gate line GL or be connected with the gate line GL. The source electrode SE may be a portion of the data line DL or be connected with the data line DL.

In some embodiments, the source electrode SE, the drain electrode DE, the gate line GL, and/or the data line DL may include copper (Cu), aluminum (Al), molybdenum (Mo), tungsten (W), gold (Au), chromium (Cr), nickel (Ni), platinum (Pt), titanium (Ti), iridium (Ir), rhodium (Rh), an alloy thereof, another suitable conductive material, or a combination thereof, but the present disclosure is not limited thereto. In some embodiments, the source electrode SE, the drain electrode DE, the gate line GL, and/or the data line DL may be formed by chemical vapor deposition, sputtering, resistance heating evaporation, electron beam evaporation, another suitable deposition process, or a combination thereof.

In some embodiments, the display panel 10 may include a plurality of pixel electrodes PE, and each of the plurality of pixel electrodes PE may be respectively disposed in each of the plurality of sub-pixel units U1. In other words, one sub-pixel unit U1 may include one pixel electrode PE, but the present disclosure is not limited thereto. In some embodiments, a plurality of pixel electrodes PE is disposed on the same layer. In some embodiments, the pixel electrode PE is used to receive the pixel voltage signal, and the pixel electrode PE may be electrically connected to the drain electrode DE of the transistor M through the opening OP. In some embodiments, any two of the plurality of pixel electrodes PE have different structures. In some embodiments, adjacent pixel electrodes PE have different structures, but the present disclosure is not limited thereto. For example, in other embodiments, non-adjacent pixel electrodes PE have different structures.

In some embodiments, the pixel electrode PE may include a transparent conductive material, such as indium tin oxide (ITO), indium zinc oxide (IZO), indium gallium zinc oxide (IGZO), aluminum-doped zinc oxide (Al-doped zinc oxide, AZO), gallium-doped zinc oxide (Ga-doped zinc oxide, GZO), another suitable transparent conductive materials, or a combination thereof, but the present disclosure is not limited thereto. In some embodiments, the pixel electrode PE may be ITO.

In some embodiments, the pixel electrode PE may have a thickness in a normal direction of the upper surface of the substrate (for example, the third direction D3 in FIG. 1). The thickness may be greater than or equal to 75 angstroms (Å) and less than or equal to 700 Å (75 Å≤the thickness of the pixel electrode≤700 Å). In the present disclosure, when viewed in a cross sectional view, the thickness refers to the maximum thickness of the pixel electrode PE measured in the cross sectional view. For example, the thickness of the pixel electrode PE may be 75 Å, 100 Å, 200 Å, 300 Å, 400 Å, 500 Å, 600 Å, 700 Å, any value or range of values between the above-mentioned values, but the present disclosure is not limited thereto. In some embodiments, when the thickness of the pixel electrode PE is greater than 700 angstroms, the periodic rainbow-like pattern generated by the external light source may be more obvious. In some embodiments, when the thickness of the pixel electrode PE is less than 75 angstroms, the reliability of the pixel electrode PE may be reduced.

As shown in FIG. 1, the pixel electrode PE may include a finger assembly 100, a crab assembly 200, and a connection assembly 300. In some embodiments, the crab assembly 200 connects the finger assembly 100 and the connection assembly 300.

In some embodiments, finger assembly 100 may include a plurality of finger portions. As shown in FIG. 1, the finger assembly 100 may include a first finger portion **100*a*, a second finger portion 100*b*, a third finger portion 100*c*, a fourth finger portion 100*d*, a fifth finger portion 100*e*, and a sixth finger portion 100*f*, but the present disclosure is not limited thereto. In other embodiments, the finger assembly 100 may include n finger portions, where n is a natural number greater than or equal to 1 and less than or equal to 100 (1≤n≤100). The number of finger portions may be adjusted according to the requirements of the display panel. In some embodiments, there may be a pitch between adjacent finger portions, so n finger portions may have n−1 pitches. In some embodiments, the first finger portion 100*a* to the sixth finger portion 100*f* are arranged sequentially and spaced along the first direction D1. For example, in the first direction D1, the second finger portion 100*b* is located between the first finger portion 100*a* and the third finger portion 100*c***.

In some embodiments, the first finger portion **100*a* to the sixth finger portion 100*f* are disposed on the same layer of the display panel 10. More specifically, insulating layers located under the first finger portion 100*a* to the sixth finger portion 100*f* and directly in contact with the first finger portion 100*a* to the sixth finger portion 100*f* may be the same insulating layer. In some embodiments, the size and/or shape of the first finger portion 100***a*, the second finger portion 100*b*, the third finger portion 100*c*, the fourth finger portion 100*d*, the fifth finger portion 100*e*, and/or the sixth finger portion 100*f* may be the same or different. For the convenience of description, in the drawings, the first finger portion 100*a* to the sixth finger portion 100*f* have the same shape, but the present disclosure is not limited thereto.

In some embodiments, the finger assembly 100 may have a height HT in the second direction D2. In some embodiments, the height HT refers to the projected length of the finger assembly 100 in the second direction D2. For example, the first finger portion 100*a* to the sixth finger portion 100*f* may have the height HT in the second direction D2. In some embodiments, the height HT may be greater than or equal to 5 microns and less than or equal to 300 microns (5 microns≤the height of the finger portion≤300 microns).

As shown in FIG. 1, in some embodiments, the crab assembly 200 may include crab portions 210 and 220. The plurality of crab portions 210 may be arranged and spaced along the first direction D1, and the plurality of crab portions 220 may be arranged and spaced along the first direction D1. In some embodiments, the connection assembly 300 may include connection portions 310 and 320. In some embodiments, the plurality of crab portions 210 may connect the connection portion 310 and the finger assembly 100, and the plurality of crab portions 220 may connect the connection portion 320 and the finger assembly 100. For example, the crab portion 210 connects the connecting portion 310 and the first finger portion 100*a*, and the crab portion 220 connects the connecting portion 320 and the first finger portion 100*a*.

As shown in FIG. 1, in the second direction D2, the crab portion 210 has a height HC1, and the crab portion 220 has a height HC2. In some embodiments, the heights HC1 and HC2 are projected lengths of the crab portions 210 and 220 in the second direction D2. In some embodiments, the height HC1 and/or the height HC2 may be greater than or equal to 2 microns and less than or equal to 6 microns (2 microns≤the height of the crab portion≤6 microns). In some embodiments, the ratio of the height HC1 to the height HT of the finger assembly 100 may be 1:1 to 1:150 (1≤the height of the finger portion/the height of the crab portion≤150). In some embodiments, the ratio of the height HC2 to the height HT of the finger assembly 100 may be 1:1 to 1:150. In some embodiments, the display panel 10 may include a light blocking member (not shown). The light blocking member may cover the crab assembly 200 and the connection assembly 300 in a normal direction of the upper surface of the substrate (for example, the third direction D3 in FIG. 1) and the light blocking member may expose the finger assembly 100.

As shown in FIG. 1, in some embodiments, the first finger portion 100*a* includes a plurality of linear portions. The first finger portion 100*a* may include m linear portions, where m is a natural number greater than or equal to 1 and less than or equal to 100 (1≤m≤100). The number of linear portions may be adjusted according to the requirements of the display panel. In some embodiments, the first finger portion 100*a* may include at least three continuous linear portions, but the present disclosure is not limited thereto. The first finger portion 100*a* may include at least four, five, or another number of continuous linear portions. The "continuous linear portion" means that one end of one linear portion of the plurality of linear portions is directly connected to one end of another adjacent linear portion. In some embodiments, the first finger portion 100*a* may further include a middle portion 140*a* connecting the plurality of linear portions, or the middle portion 140*a* may be omitted. In some embodiments, the middle portion 140*a* may be provided in one or in plural. In some embodiments, the middle portion 140*a* may include a bending portion or an arcuate portion. In some embodiments, when the middle portion 140*a* is omitted, at least a portion of the finger portions of each of the first finger portion 100*a* to the sixth finger portion 100*f* may be integrally regarded as a linear portion, respectively, as shown in FIG. 5.

As shown in FIG. 1, in some embodiments, the first finger portion 100*a* may include a first linear portion 110*a*, a second linear portion 120*a*, a third linear portion 130*a*, a middle portion 140*a*, and a fourth linear portion 150*a*, the fifth linear portion 160*a*, and the sixth linear portion 170*a* connected in sequence, but the present disclosure is not limited thereto. In some embodiments, two ends of the second linear portion 120*a* may be directly connected to the first linear portion 110*a* and the third linear portion 130*a*, respectively.

Figure 2:
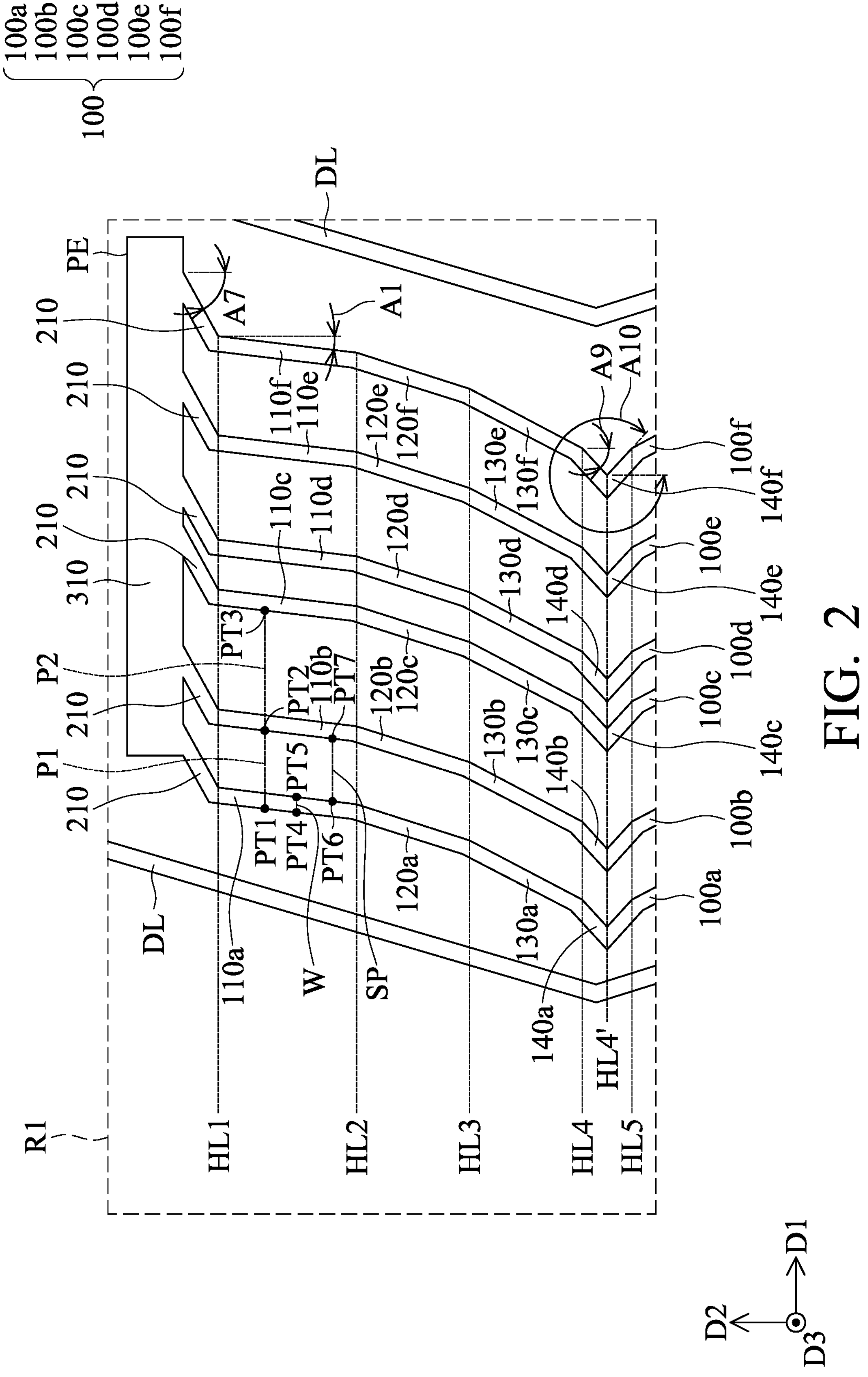
FIG. 2 is a schematic top view showing a region R1 in FIG. 1 according to other embodiments of the present disclosure.

Referring to FIG. 1 and FIG. 2. FIG. 2 is a schematic top view showing the region R1 in FIG. 1 according to some embodiments of the present disclosure. As shown in FIG. 1, in some embodiments, different portions of the first finger portion 100*a* may be integrally formed in substantially the same process. Therefore, different portions of the first finger portion 100*a* may be divided according to two adjacent virtual horizontal lines (of virtual horizontal lines HL1 to HL8) that are parallel to the first direction D1. It should be noted that the virtual horizontal line is a virtual line extending along the horizontal direction (such as the direction parallel to the first direction D1 in FIG. 2) at the bending point of each linear portion. In some embodiments, the upper endpoint (the endpoint closer to the connecting portion 310) of the right boundary of the linear portion is used as the bending point. For example, in FIG. 2, the intersection point of the right boundary of the crab portion 210 and the right boundary of the first linear portion 110*f* is used as the bending point of the first linear portion 110*f* of the sixth finger portion 100*f*. In some other embodiments, the right boundary of the bending portion where two adjacent linear portions are connected may be an arcuate boundary. Tangent lines of the arcuate boundary are defined by drawing an extending line with the respective right boundaries of two adjacent linear portions. The intersection point of the two tangent lines is used as the bending point. After the virtual horizontal lines are set according to the above description, the portion between the virtual horizontal lines HL1 and HL2 is the first linear portion 110*a*. Like the first linear portion 110*a*, the second linear portion 120*a* and the third linear portion 130*a* are each interposed between two adjacent virtual horizontal lines (from virtual horizontal line HL2 to virtual horizontal line HL4), and the fourth linear portion 150*a* to the sixth linear portion 170*a* are respectively interposed between two adjacent virtual horizontal lines HL5 to HL8. In some embodiments, the middle portion 140*a* is disposed between virtual horizontal lines HL4 and HL5.

In some embodiments, in the second direction D2, the first linear portion 110*a* to the sixth linear portion 170*a* may have corresponding heights H1 to H6, respectively. In some embodiments, the heights H1 to H6 are projected lengths of the first linear portion 110*a* to the sixth linear portion 170*a* in the second direction D2, respectively. In some embodiments, heights H1, H2, H3, H4, H5, and/or H6 may be the same or different. In some embodiments, in the second direction D2, the middle portion 140*a* has a height HM. In some embodiments, the height HM is the projected length of the middle portion 140*a* in the second direction D2. In some embodiments, the height HM may be greater than or equal to 4 microns and less than or equal to 12 microns (4 microns≤height HM≤12 microns).

Similar to the first finger portion 100*a*, the second finger portion 100*b*, third finger portion 100*c*, fourth finger portion 100*d*, fifth finger portion 100*e*, and/or sixth finger portion 100*f* may include corresponding linear portions. For the sake of brevity, the linear portions will not be repeated.

As shown in FIG. 1, at least two of the height H1 of the first linear portion 110*a*, the height H2 of the second linear portion 120*a*, and the height H3 of the third linear portion 130*a* are the same, but the present disclosure is not limited thereto. In some other embodiments, the height H1, the height H2, and the height H3 are the same. In some other embodiments, the height H1, the height H2, and the height H3 are different from each other. Similarly, in some embodiments, at least two of the heights H4, H5, and H6 are the same, the heights H4, H5, and H6 are the same, or the heights H4, H5, and H6 are different from each other.

Please continue to refer to FIG. 1 and FIG. 2. In some embodiments, each linear portion of the plurality of finger portions in the finger assembly 100 may have a deviation angle (off angle) (such as, the first deviation angle A1 to the sixth deviation angle A6), and each middle portion may have a deviation angle (such as, the ninth deviation angle A9 and the tenth deviation angle A10), and the crab portions 210 and 220 in the crab assembly 200 may have deviation angles (such as, the seventh deviation angle A7 and the eighth deviation angle A8). In addition, in some embodiments, there may be a pitch between the plurality of finger portions in the finger assembly 100 (such as, the first pitch P1 to the fifth pitch P5). The deviation angles and pitches are described in detail below.

As shown in FIG. 2, the first finger portion 100*a* may be vertically symmetrical (mirror symmetrical) with the virtual horizontal line HL4' as the symmetrical axis, but the present disclosure is not limited thereto. Similarly, the second finger portion 100*b* to the sixth finger portion 100*f* may also be vertically symmetrical with the virtual horizontal line HL4' as the symmetrical axis. In some other embodiments, the first finger portion 100*a* to the sixth finger portion 100*f* may have an asymmetric structure. For example, a portion of the first finger portion 100*a* above the virtual horizontal line HL4' is asymmetrical to a portion of the first finger portion 100*a* below the virtual horizontal line HL4'.

For brevity of description, the region R1 shows the first linear portions 110*a* to 110*f*, the second linear portions 120*a* to 120*f*, the third linear portions 130*a* to 130*f*, and the middle portions 140*a* to 140*f* of the first finger portion 100*a* to sixth finger portion 100*f*. In the following, the first pitch P1, the second pitch P2, the electrode width W, and the space width SP are described by taking the first finger portion 100*a* and the second finger portion 100*b* as examples. Hereinafter, since the first finger portion 100*a* to the sixth finger portion 100*f* are identical to and parallel to each other, the first deviation angle A1 is described by taking the first linear portion 110*f* as an example, and the ninth deviation angle A9 and the tenth deviation angle A10 are described by taking the middle portion 140*f* as an example.

As shown in FIG. 2, in some embodiments, in the first direction D1, the first pitch P1 may be between the first finger portion 100*a* and the second finger portion 100*b*. In some embodiments, the first pitch P1 is defined by the distance between the point PT1 and the point PT2. The point PT1 is any point on the left boundary of the first finger portion 100*a*, and the point PT2 is the intersection point of the virtual horizontal line passing through the point PT1 and parallel to the first direction D1 and the left boundary of the second finger portion 100*b*. The second pitch P2 is defined by the distance between the point PT2 and the point PT3. The point PT3 is the intersection point of the virtual horizontal line passing through the point PT2 and parallel to the first direction D1 and the left boundary of the third finger portion 100*c*. The third to fifth pitches P3 to P5 between adjacent two of the third to sixth finger portions 100*c* to 100*f* may be defined in a manner similar to the first pitch P1. In some embodiments, the first pitch P1 to the fifth pitch P5 may be greater than or equal to 2 microns and less than or equal to 10 microns (2 microns≤the pitch between adjacent finger portions≤10 microns).

In some embodiments, the first finger portion 100*a* may have an electrode width W in the first direction D1. In some embodiments, the electrode width W is defined by the point PT4 and the point PT5. The point PT4 is any point on the left boundary of the first finger portion 100*a*. The point PT5 is an intersection point of a virtual horizontal line passing through the point PT4 and parallel to the first direction D1 and the right boundary of the first finger portion 100*a*. In some embodiments, the electrode width W may be greater than or equal to 0.5 microns and less than or equal to 9 microns (0.5 microns≤the electrode width W≤9 microns).

In some embodiments, in the first direction D1, the space width SP is between the first finger portion 100*a* and the second finger portion 100*b*. In some embodiments, space width SP is defined by the point PT6 and the point PT7. The point PT6 is any point on the right boundary of the first finger portion 100*a*. The point PT7 is an intersection point of a virtual horizontal line passing through the point PT6 and parallel to the first direction D1 and the left boundary of the first finger portion 100*a*. In some embodiments, the space width SP may be greater than or equal to 1 micron and less than or equal to 9.5 microns (1 micron≤the space width SP≤9.5 microns).

In some embodiments, the first pitch P1 is the sum of the electrode width W and the space width SP. In some embodiments, the ratio of the electrode width W to the space width SP is in the range of 1/19 to 9 (1/19≤the electrode width W/the space width SP<9). For example, the ratio of the electrode width W to the space width SP may be 9, 3, 1, 1/2, 1/3, 1/4, or 1/19, but the present disclosure is not limited thereto. In some embodiments, the ratio of the electrode width W to the space width SP (the electrode width W/the space width SP) is 0.3 to 19 (0.3≤the electrode width W/the space width SP≤19). For example, the ratio of the electrode width W to the space width SP is 0.3, 0.4, 0.5, 0.6, 0.7, 0.8, 0.9, 1, 2, 3, 4, 5, 6, 7, 8, 9, 10, 11, 12, 13, 14, 15, 16, 17, 18, 19, any value or range of values between the above-mentioned values, but the present disclosure is not limited thereto.

As shown in FIG. 2, the first linear portion 110*f* may have a first deviation angle A1. Hereinafter, since the first linear portion 110*f* has a physical width, the first deviation angle A1 is defined hereinafter by the right boundary of the first linear portion 110*f*. More specifically, in some embodiments, the first deviation angle A1 is the included angle measured clockwise from a virtual vertical line to the right boundary of the first linear portion 110*f*, wherein the virtual vertical line passes through the bending point, is parallel to the second direction D2, and is toward the connecting portion 320.

In some embodiments, the second deviation angle A2 of the second linear portions 120*a* to 120*f* and the third deviation angle A3 of the third linear portions 130*a* to 130*f* may be defined similarly to the first deviation angle A1. The fourth deviation angle A4 to the sixth deviation angle A6 of others linear portions may also be defined similarly to the first deviation angle A1. The seventh deviation angle A7 of the crab portion 210 and the eighth deviation angle A8 of the crab portion 220 may also be defined similarly to the first deviation angle A1. It should be noted that, according to the above measurement method, in FIG. 1 and FIG. 2, the first deviation angle A1, the second deviation angle A2, the third deviation angle A3, the seventh deviation angle A7, and the ninth deviation angle A9 are all within the range of 0 degrees (°) to 90 degrees (0 degrees≤the first deviation angle A1, the second deviation angle A2, the third deviation angle A3, the seventh deviation angle A7, or the ninth deviation angle A9≤90 degrees). In FIG. 1, the fourth deviation angle A4, the fifth deviation angle A5, the sixth deviation angle A6, the eighth deviation angle A8, and the tenth deviation angle A10 are all within the range of 270 degrees to 360 degrees (270 degrees<the fourth deviation angle A4, the fifth angle A5, the sixth angle A6, the eighth angle A8, or the tenth angle A10≤360 degrees).

In some embodiments, the crab portion 210 may deviate further from the virtual vertical line extending from the bending point than the linear portion of the finger portion. For example, in FIG. 1, the seventh deviation angle A7 is greater than the first deviation angle A1 of the first linear portion 110*a*. In some embodiments, the seventh deviation angle A7 may be greater than or equal to 30 degrees and less than or equal to 40 degrees (30 degrees≤the seventh deviation angle A7≤40 degrees). The eighth deviation angle A8 may be greater than or equal to 320 degrees and less than or equal to 330 degrees (320 degrees≤the eighth deviation angle A8≤330 degrees).

As shown in FIG. 2, the middle portion 140*f* is a bending portion, so the upper portion of the middle portion 140*f* may have the ninth deviation angle A9, and the lower portion of the middle portion 140*f* may have the tenth deviation angle A10. In some embodiments, the ninth deviation angle A9 may be greater than or equal to 30 degrees and less than or equal to 40 degrees (30 degrees≤the ninth deviation angle A9≤40 degrees), and the tenth deviation angle A10 may be greater than or equal to 320 degrees and less than or equal to 330 degrees (320 degrees≤the tenth deviation angle A10≤330 degrees).

Referring to FIG. 3, it shows a schematic top view of a display device 2 including a sub-pixel unit U2 according to some embodiments of the present disclosure. For ease of description, components with the same or similar reference numerals as those described above will not be repeated.

As shown in FIG. 3, the middle portion is omitted in the finger assembly 100. The finger assembly 100 may include a first finger portion 100*a* to a sixth finger portion 100*f*. The first finger portion 100*a* includes a first linear portion 110*a*, a second linear portion 120*a*, and a third linear portion 130*a*. The first linear portion 110*a* is connected to the second linear portion 120*a*, and the second linear portion 120*a* is connected to the third linear portion 130*a*. The deviation directions of the crab portions 210 and 220 are similar. That is, the deviation angles of the crab portions 210 and 220 may be in the range of greater than or equal to 30 degrees to less than or equal 40 degrees (30 degrees≤the deviation angle of the crab portion≤40 degrees). The first linear portion 110*a* has a first deviation angle A1, the second linear portion 120*a* has a second deviation angle A2, and the third linear portion 130*a* has a third deviation angle A3. The second finger portion 100*b* to the sixth finger portion 100*f* have substantially the same appearance as the first finger portion 100*a*, respectively, so details are not repeated hereinafter. As shown in FIG. 3, the first deviation angle A1, the second deviation angle A2, and the third deviation angle A3 are different from each other. For example, in some embodiments, there is an increasing tendency among the first deviation angle A1, the second deviation angle A2, and the third deviation angle A3. That is, the second deviation angle A2 is greater than the first deviation angle A1, and the third deviation angle A3 is also greater than the first deviation angle A1. In other embodiments, the first deviation angle A1, the second deviation angle A2, and the third deviation angle A3 are the same, so that each of the first finger portion 100*a* to the sixth finger portion 100*f* form a single linear portion, as shown in FIG. 5.

Referring to FIG. 4, it shows a schematic top view of a display device 3 including a sub-pixel unit U3 according to some embodiments of the present disclosure. In some embodiments, as shown in FIG. 4, the first pitch P1 between the first finger portion 100*a* and the second finger portion 100*b* is different from the second pitch P2 between the second finger portion 100*b* and the third finger portion 100*c*. The third pitch P3 between the third finger portion 100*c* and the fourth finger portion 100*d* is different from the first pitch P1, and the third pitch P3 is different from the second pitch P2. In some embodiments, the first pitch P1 to the third pitch P3 gradually decrease, and the third pitch P3 to the fifth pitch P5 gradually increase. In some embodiments, two adjacent pitches (from the first pitch P1 to the third pitch P3) are different from each other. In some embodiments, two adjacent pitches (from the second pitch P2 to the fourth pitch P4) are the same as each other. In other embodiments, the third pitch P3 is the same as the first pitch P1 or the second pitch P2. In some embodiments, the first deviation angles A1 of the first finger portion 100*a* to the sixth finger portion 100*f* are the same.

In some embodiments, the variation rate of adjacent pitches such as the first pitch P1 and the second pitch P2 ((second pitch P2−first pitch P1)/first pitch P1×100%) may be greater than or equal to 3% and less than or equal to 100% (3%≤the variation rate of adjacent pitches≤100%). For example, the variation rate of adjacent pitches may be 3%, 5%, 10%, 15%, 20%, 30%, 40%, 60%, 80%, 100%, any value or range of values between the above-mentioned values, but the present disclosure is not limited thereto. In some embodiments, the variation of adjacent pitches such as the first pitch P1 and the second pitch P2 (the second pitch P2 minus the first pitch P1) may be greater than or equal to 0.5 microns and less than or equal to 8 microns (0.5 microns≤the variation of adjacent pitches≤8 microns). For example, the variation of adjacent pitches may be 0.5 microns, 1 micron, 1.5 microns, 2 microns, 3 microns, or any value or range of values between the above-mentioned values, but the present disclosure is not limited thereto.

For example, exemplary numerical values (in microns) or relative length ratios (dimensionless) of the first pitch P1 to the fifth pitch P5 are shown in Table 1, but the present disclosure is not limited thereto.

TABLE 1

| Serial number of pitch | Example 1 | Example 2 | Example 3 | Example 4 | Example 5 | Example 6 |
|---|---|---|---|---|---|---|
| First pitch P1 | 8 | 6 | 6 | 6 | 6 | 6 |
| Second pitch P2 | 7 | 7 | 7 | 6 | 7 | 6 |

TABLE 1-continued

| Serial number of pitch | Example 1 | Example 2 | Example 3 | Example 4 | Example 5 | Example 6 |
|---|---|---|---|---|---|---|
| Third pitch P3 | 6 | 7 | 8 | 7 | 8 | 7 |
| Fourth pitch P4 | 7 | 7 | 7 | 7 | 6 | 8 |
| Fifth pitch P5 | 8 | 6 | 6 | 8 | 7 | 8 |

Referring to FIG. 5. The main difference between FIG. 5 and FIG. 4 is the appearance of the first finger portion 100*a* to the sixth finger portion 100*f*, and the extending direction of the crab portion located below the first finger portion 100*a* to the sixth finger portion 100*f* in FIG. 5 is different from the extending direction of the crab portion located below the finger portion (for example, the first finger portion 100*a* to the sixth finger portion 100*f*) in FIG. 4. According to some embodiments of the present disclosure, it shows a schematic top view of the display device 4 including the sub-pixel unit U4. As shown in FIG. 5, the third pitch P3 is different from the first pitch P1, and the third pitch P3 is different from the second pitch P2. The first deviation angles A1 of the first finger portion 100*a* to the sixth finger portion 100*f* are the same, but the pitches and variation rate of the deviation angle in the present disclosure are not limited thereto.

Figure 6:
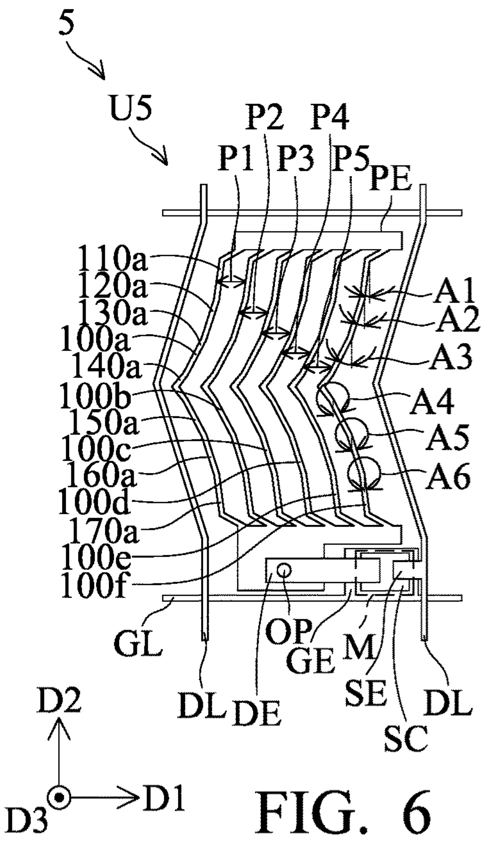

Referring to FIG. 6, it shows a schematic top view of a display device 5 including a sub-pixel unit U5 according to some embodiments of the present disclosure. As shown in FIG. 5, the first deviation angle A1 of the first linear portion 110*a*, the second deviation angle A2 of the second linear portion 120*a*, and the third deviation angle A3 of the third linear portion 130*a* are different from each other, and the first deviation angle A1, the second deviation angle A2, and the third deviation angle A3 have an increasing tendency. The increasing tendency represents that the first deviation angle A1, the second deviation angle A2, and the third deviation angle A3 gradually increase in the clockwise direction (when viewed in a top view). That is, the first deviation angle A1 is smaller than the second deviation angle A2, and the second deviation angle A2 is smaller than the third deviation angle A3.

In some embodiments, the variation of the deviation angles of adjacent linear portions such as the first linear portion 110*a* and the second linear portion 120*a* (for example, the second deviation angle A2 minus the first deviation angle A1) may be greater than or equal to 0.5 degrees and less than or equal to 30 degrees (0.5 degrees≤the variation of the deviation angles≤30 degrees), but the present disclosure is not limited thereto. For example, the second deviation angle A2 is greater than the first deviation angle A1, and the difference of the angles is greater than or equal to 0.5 degrees and less than or equal to 30 degrees. The third deviation angle A3 is greater than the second deviation angle A2, and the difference of the angles is greater than or equal to 0.5 degrees and less than or equal to 30 degrees. In some other embodiments, if the first finger portion 100*a* above the virtual horizontal line HL4' includes p continuous linear portions, and p is a natural number greater than or equal to 3 and less than or equal to 100, the variation of the deviation angles may be greater than or equal to 0.5 degrees and less than or equal to 90/p degrees (0.5 degrees≤the variation of the deviation angles≤(90/p) degrees). In addition, according to the above-mentioned measurement method, in some embodiments, the fourth deviation angle A4, the fifth deviation angle A5, and the sixth deviation angle A6 may also have an increasing tendency (a rising trend). In addition, as shown in FIG. 6, the first pitch P1 to the fifth pitch P5 may be the same.

Figure 7:
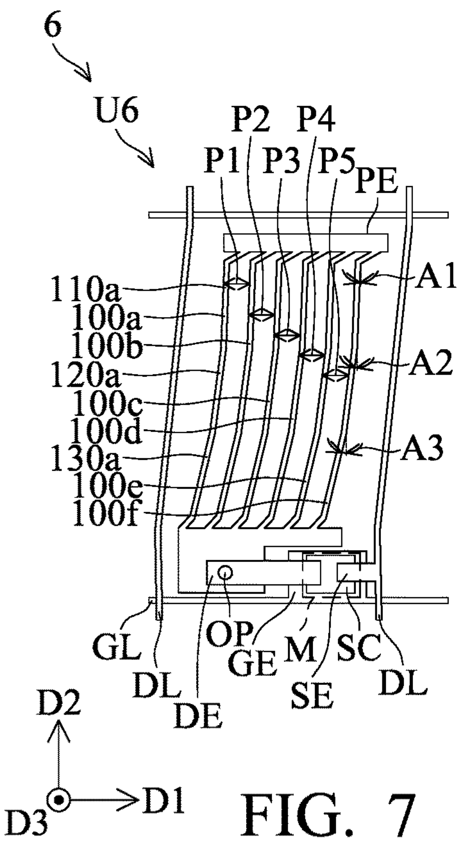

Referring to FIG. 7, it shows a schematic top view of a display device 6 including a sub-pixel unit U6 according to some embodiments of the present disclosure. The main difference between FIG. 7 and FIG. 6 is the appearance of the first finger portion 100*a* to the sixth finger portion 100*f*, and the extending direction of the crab portion located below the first finger portion 100*a* to the sixth finger portion 100*f* in FIG. 7 is different from the extending direction of the crab portion located below the finger portion (for example, the first finger portion 100*a* to the sixth finger portion 100*f*) in FIG. 6. As shown in FIG. 7, the first deviation angle A1, the second deviation angle A2, and the third deviation angle A3 have an increasing tendency, and the first pitch P1 to the fifth pitch P5 may be the same.

Figure 8:
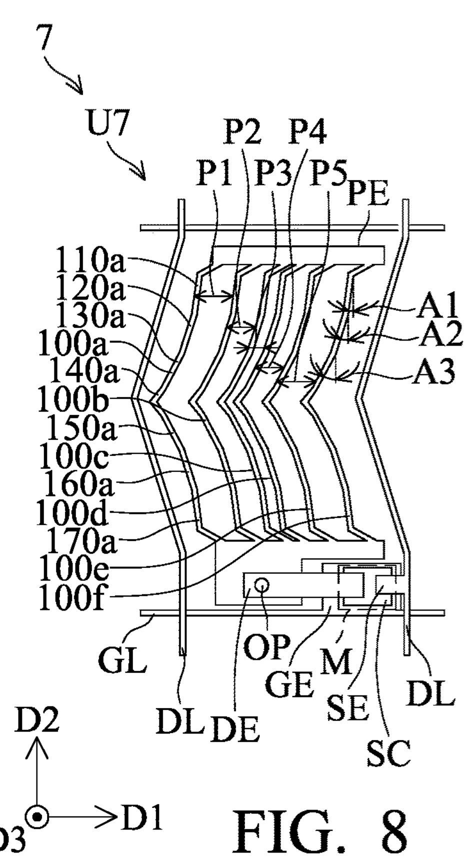
Figure 9:
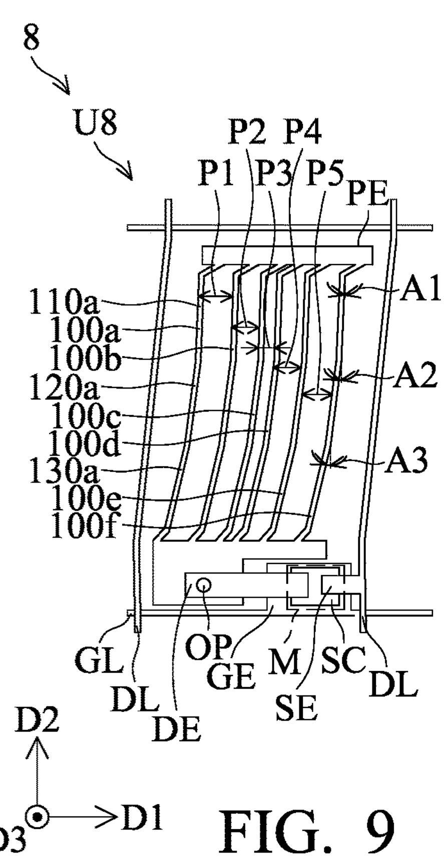

Referring to FIG. 8 and FIG. 9, they show schematic top views of the display device 7 including the sub-pixel unit U7 and the display device 8 including the sub-pixel unit U8 according to some embodiments of the present disclosure, respectively. As shown in FIG. 8 and FIG. 9, the first pitch P1 is different from the second pitch P2, and the first deviation angle A1, the second deviation angle A2, and the third deviation angle A3 have an increasing tendency. The main difference between FIG. 8 and FIG. 9 is the appearance of the first finger portion 100*a* to the sixth finger portion 100*f*, and the extending direction of the crab portion located below the first finger portion 100*a* to the sixth finger portion 100*f* in FIG. 9 is different from the extending direction of the crab portion located below the finger portion (for example, the first finger portion 100*a* to the sixth finger portion 100*f*) in FIG. 8.

Accordingly, in each pixel electrode of each sub-pixel unit of the present disclosure, the pitches between the finger portions may be different, the deviation angles of linear portions may have an increasing tendency, and/or the height ratio of each linear portion may be adjusted. Thus, the interference and diffraction effect caused by the external light irradiating the display panel may be affected. Therefore, the rainbow-like pattern may be weakened and/or the rainbow-like pattern may fade and blur.

Figure 10:
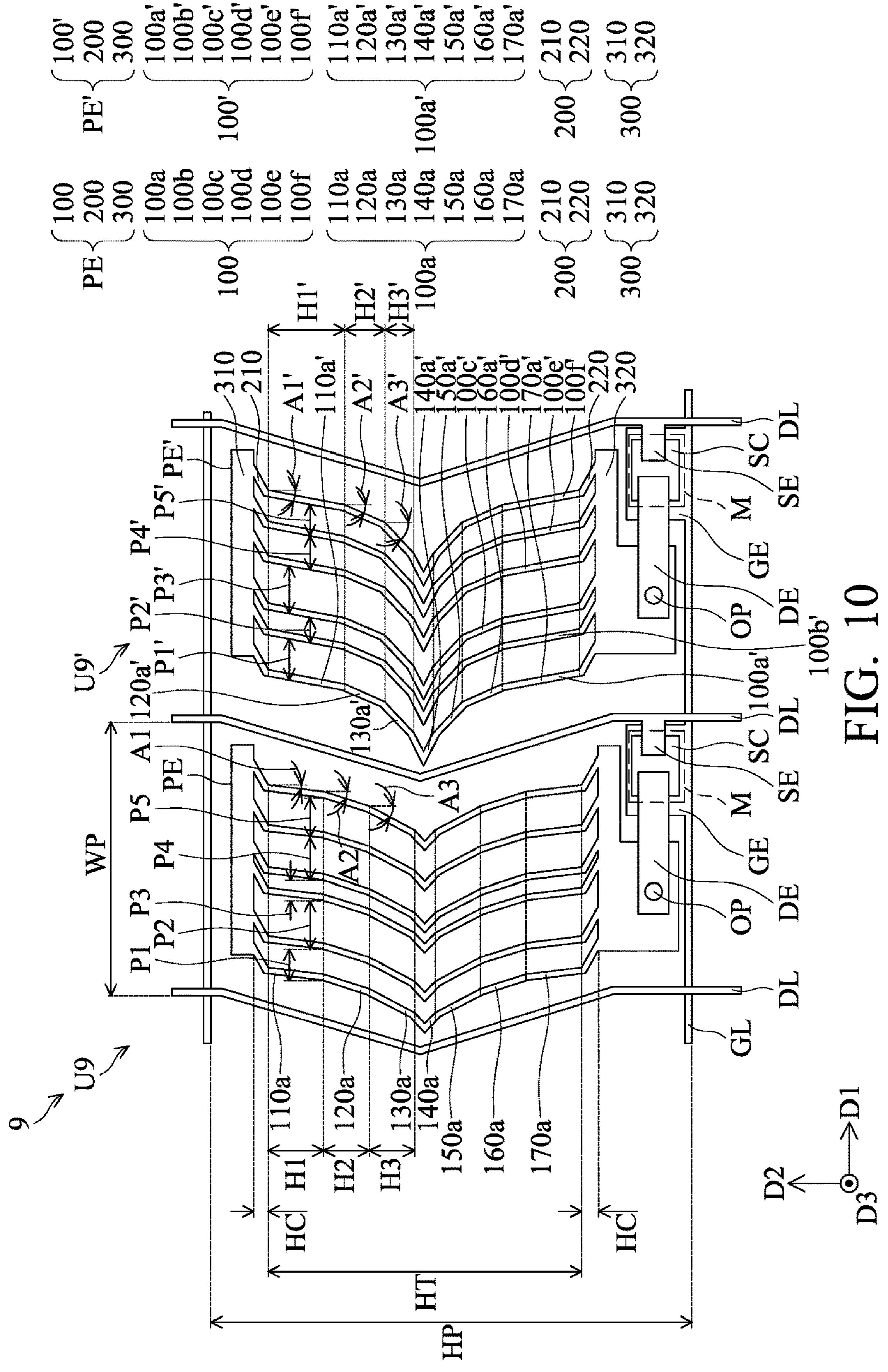

Referring to FIG. 10, it shows a schematic top view of a display device 9 including sub-pixel units U9 and U9' according to some embodiments of the present disclosure. FIG. 10 shows the sub-pixel unit U9 and another sub-pixel unit U9'. The sub-pixel unit U9 may be adjacent to or not adjacent to another sub-pixel unit U9'. The pixel electrode PE is disposed in the sub-pixel unit U9, and another pixel electrode PE' is disposed in the sub-pixel unit U9'. For example, the sub-pixel unit U9 may be a red sub-pixel unit, and the sub-pixel unit U9' may be a green sub-pixel unit or a blue sub-pixel unit, but the present disclosure is not limited thereto.

As shown in FIG. 10, in some embodiments, the (other) pixel electrode PE' may include a finger assembly 100', a crab assembly 200, and a connection assembly 300. In some embodiments, the finger assembly 100' may include a first finger portion 100*a'* to a sixth finger portion 100*f'*. Two adjacent finger portions (from the first to sixth finger portions 100*a'* to 100*f'*) may have a first pitch P1' to a fifth pitch P5'. The first finger portion 100*a'* may include a first linear portion 110*a'* to a third linear portion 130*a'*, a middle portion 140*a'*, and a fourth linear portion 150*a'* to a sixth linear portion 170*a'*, but the number of linear portions is not limited thereto. In some embodiments, the first linear portion 110*a'* to the third linear portion 130*a'* may have a first deviation angle A1' to a third deviation angle A3', respectively. Similarly, the middle portion 140*a'* and the fourth linear portion 150*a'* to the sixth linear portion 170*a'* may have deviation angles, respectively. The first linear portion 110a' to the third linear portion 130a' may have heights H1' to H3', respectively. Similarly, the middle portion 140a' and the fourth to sixth linear portions 150a' to 170a' may have heights, respectively.

As shown in FIG. 10, in some embodiments, the first deviation angle A1 to the third deviation angle A3 of the pixel electrode PE may be the same or different, and the first deviation angle A1' to the third deviation angle A3' of the pixel electrode PE' may be the same or different. In some embodiments, the first deviation angle A1', the second deviation angle A2', and the third deviation angle A3' of the pixel electrode PE' in the sub-pixel unit U9' have an increasing tendency. In some embodiments, the first deviation angle A1, the second deviation angle A2, and the third deviation angle A3 of the pixel electrode PE in the sub-pixel unit U9 have a first increasing tendency, and the first deviation angle A1', the second deviation angle A2', and the third deviation angle A3' of the pixel electrode PE' in the sub-pixel unit U9' have an second increasing tendency, and the first increasing tendency and the second increasing tendency may be the same or different. That is, the difference between the second deviation angle A2 and the first deviation angle A1 of the pixel electrode PE in the sub-pixel unit U9 may be the same as or different from the difference between the second deviation angle A2' and the first deviation angle A1' of the pixel electrode PE' in the sub-pixel unit U9'. Also, the difference between the third deviation angle A3 and the second deviation angle A2 of the pixel electrode PE in the sub-pixel unit U9 may be the same as or different from the difference between the third deviation angle A3' and the second deviation angle A2' of the pixel electrode PE' in the sub-pixel unit U9'.

In some embodiments, exemplary values (in degrees) of the first deviation angles A1 and A1' to the third deviation angles A3 and A3' are shown in Table 2, but the present disclosure is not limited thereto.

TABLE 2

| Serial number of the deviation angle | Example 1 | Example 2 | Example 3 | Example 4 | Example 5 | Example 6 |
|---|---|---|---|---|---|---|
| first deviation angle A1 | 0 | 0 | 7 | 5 | 2 | 5 |
| second deviation angle A2 | 7 | 7 | 7 | 10 | 7 | 6 |
| third deviation angle A3 | 14 | 14 | 7 | 15 | 12 | 7 |
| first deviation angle A1' | 0.5 | 0 | 7.5 | 10 | 7 | 5 |
| second deviation angle A2' | 7.5 | 7.5 | 7.5 | 20 | 7 | 7 |
| third deviation angle A3' | 14.5 | 15 | 7.5 | 30 | 7 | 9 |

In some other embodiments, the deviation angles of the linear portions of different finger portions in the pixel electrode PE may be different. For example, the first deviation angle A1 of the first linear portion 110a of the first finger portion 100a in the pixel electrode PE may be different from the first deviation angle A1 of the first linear portion 110b of the second finger portion 100b in the pixel electrode PE.

As shown in FIG. 10, in some embodiments, the first pitch P1 between the first finger portion 100a and the second finger portion 100b in the pixel electrode PE may be different from the first pitch P1' between the first finger portion 100a' and the second finger portion 100b' in the pixel electrode PE'.

As shown in FIG. 10, in some embodiments, the heights H1' to H3' of the first linear portion 110a' to the third linear portion 130a' in the pixel electrode PE' may be different from each other. In some embodiments, the height H1, the height H2, and the height H3 in the pixel electrode PE have a first height ratio (the height H1:the height H2:the height H3), and the height H1', the height H2', and the height H3' has a second height ratio (the height H1':the height H2':the height H3'), and the first height ratio may be the same as or different from the second height ratio. For example, in some embodiments, the heights H1 to H3 in the pixel electrode PE may be the same as each other, so the first height ratio may be 1:1:1. In some embodiments, at least two of the height H1' to the height H3' of the pixel electrode PE' may be the same or different from each other, for example, the second height ratio may be 1:1:1, 2:1:1, 1:2:1, 1:1:2, 3:1:1, 3:2:1, 3:1:2, 1:3:1, 1:3:2, 2:3:1, 1:1:3, 1:2:3, 2:1:3 or other suitable height ratios, but the first height ratio and the second height ratio in the present disclosure are not limited thereto.

In some embodiments, the heights of the linear portions of different finger portions in the pixel electrode PE may be different. For example, the height H1 of the first linear portion 110a of the first finger portion 100a in the pixel electrode PE is different from the height H1 of the first linear portion 110b of the second finger portion 100b in the pixel electrode PE.

In some other embodiments, another pixel electrode (not shown) different from the pixel electrode PE and the pixel electrode PE' is provided, and the first to fifth pitches of another pixel electrode may be the same, and the first pitch of the other pixel electrode is different from the first pitch P1 and the first pitch P1'. In some embodiments, the first deviation angle of another pixel electrode is different from the first deviation angle A1 and the first deviation angle A1'. In some embodiments, the increasing tendency of another pixel electrode is different from the first increasing tendency and the second increasing tendency. In some embodiments, the height ratio of the other pixel electrode is different from the first height ratio and the second height ratio.

Figure 11:
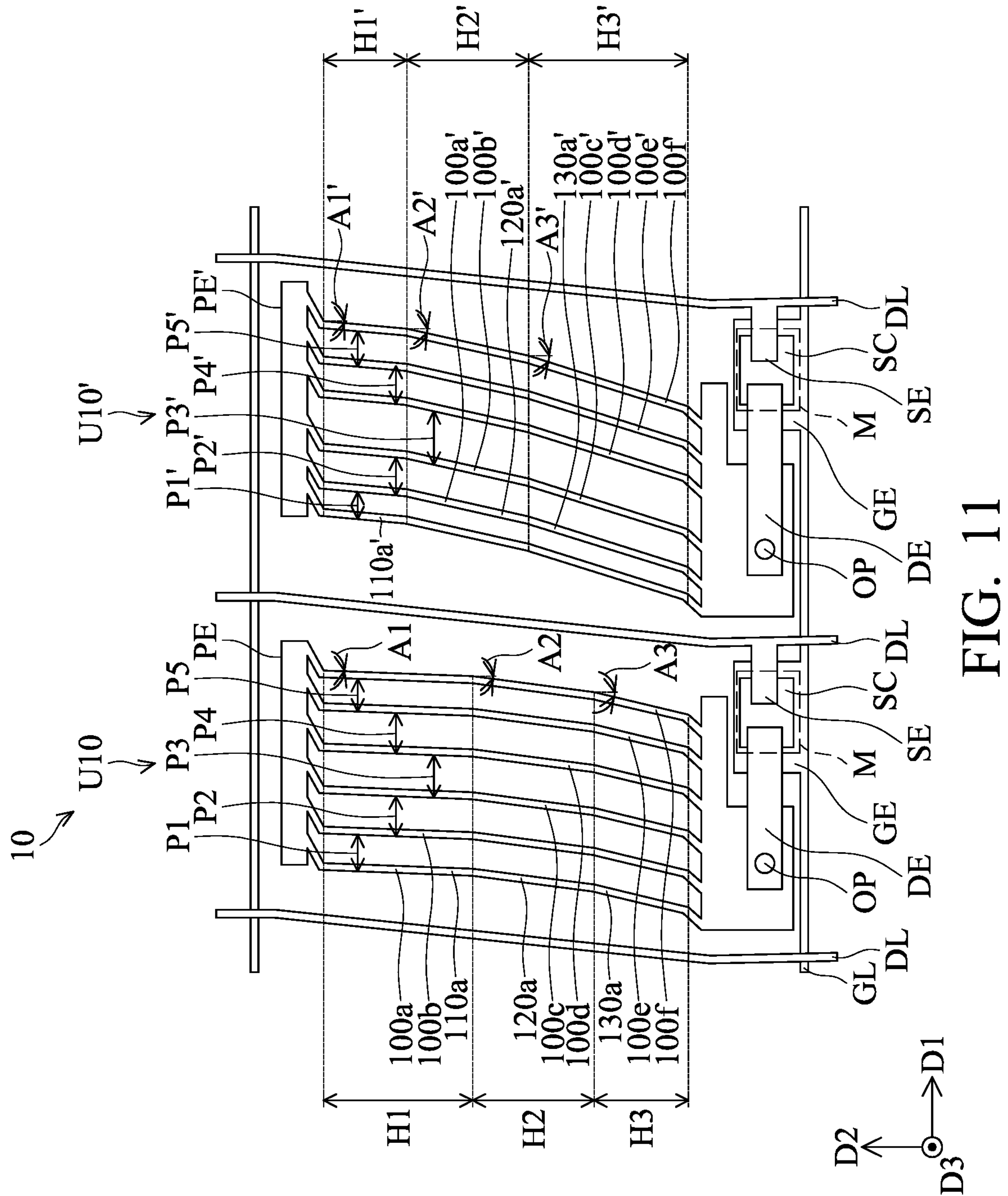

Referring to FIG. 11, it shows a schematic top view of a display device 10 including sub-pixel units U10 and U10' according to some embodiments of the present disclosure. The main difference between FIG. 10 and FIG. 11 is the appearance of the first finger portion 100a to the sixth finger portion 100f, and the extending direction of the crab portion located below the first finger portion 100a to the sixth finger portion 100f in FIG. 11 is different from the extending direction of the crab portion located below the finger portion (for example, the first finger portion 100a to the sixth finger portion 100f) in FIG. 10. As for the appearance in the finger portions of the sub-pixel units U10 and U10' in FIG. 11, such as the differences in the height, the variation of the deviation angle, and the height ratio of linear portions, refers to the relevant description in FIG. 10, and the similar description will not be repeated.

Figure 12:
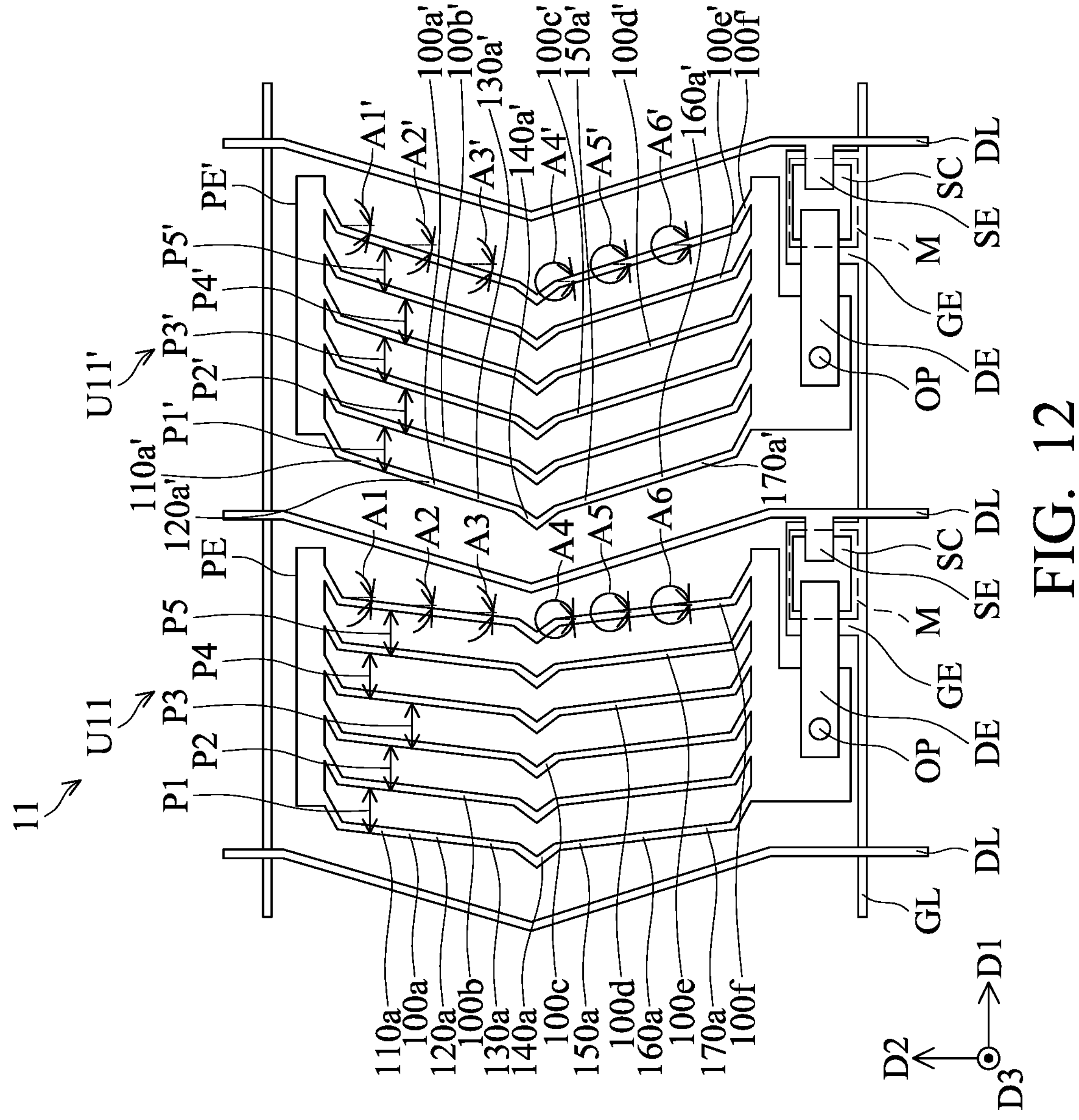
Figure 13:
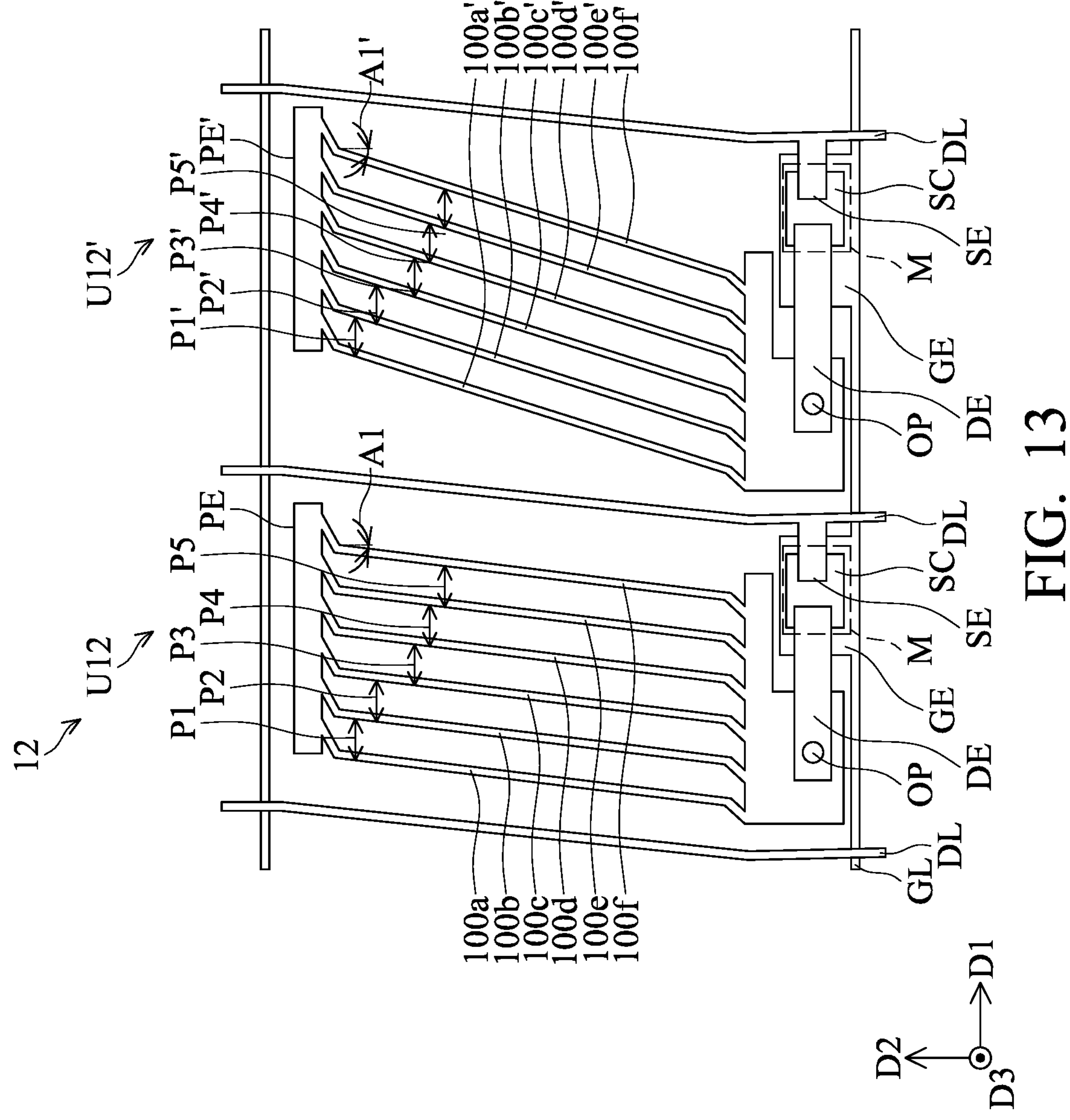

Referring to FIG. 12 and FIG. 13, they show schematic top views of a display device 11 including sub-pixel units U11 and U11' and a display device 12 including sub-pixel units U12 and U12' according to some embodiments of the present disclosure, respectively. It should be noted that, the difference between FIG. 12 and FIG. 10 is the pitches of finger portions in the pixel electrode PE may be the same as the pitches of finger portions in the pixel electrode PE' in FIG. 12. In addition, in FIG. 12, since the deviation angles of each linear portion of each finger portion (for example, the first linear portion 110*a* to the third linear portion 130*a* of the first finger portion 100*a* in the sub-pixel unit U11) above the middle portion (for example, the middle portion 140*a* in the sub-pixel unit U11 and the middle portion 140*a*' in the sub-pixel unit U11') remain the same, the portions of each finger portion above the middle portion may be considered as single linear portions. Similarly, since the deviation angles of each linear portion of each finger portion (for example, the fourth linear portion 150*a* to the sixth linear portion 170*a* of the first finger portion 100*a* in the sub-pixel unit U11) below the middle portion remain the same, the portions of each finger portion below the middle portion may be considered as single linear portions.

Similarly, the difference between FIG. 13 and FIG. 11 is that the pitch of each finger portion in the pixel electrode PE and the pitch of each finger portion in the pixel electrode PE' may be the same in FIG. 13. Also, in FIG. 13, each finger portion of the pixel electrode PE and the pixel electrode PE' may be regarded as a single linear portion, respectively.

As shown in FIG. 12 and FIG. 13, in some embodiments, the first pitch P1 to the fifth pitch P5 in the pixel electrode PE are the same as each other, and the first pitch P1' to the fifth pitch P5 in the pixel electrode PE' are the same as each other, and the first pitch P1 of the pixel electrode PE and the first pitch P1' of the pixel electrode PE' may be the same. In some other embodiments, the first deviation angle A1 in the pixel electrode PE may be different from the first deviation angle A1' in the pixel electrode PE'. In some embodiments, the difference between the first deviation angle A1 in the pixel electrode PE and the first deviation angle A1' in the pixel electrode PE' may be greater than or equal to 0.5 degrees and less than or equal to 30 degrees (0.5 degrees≤the difference of the deviation angles≤degrees). For example, the first deviation angle A1 may be 7 degrees and the first deviation angle A1' may be 7.5 degrees, but the present disclosure is not limited thereto.

Figure 14:
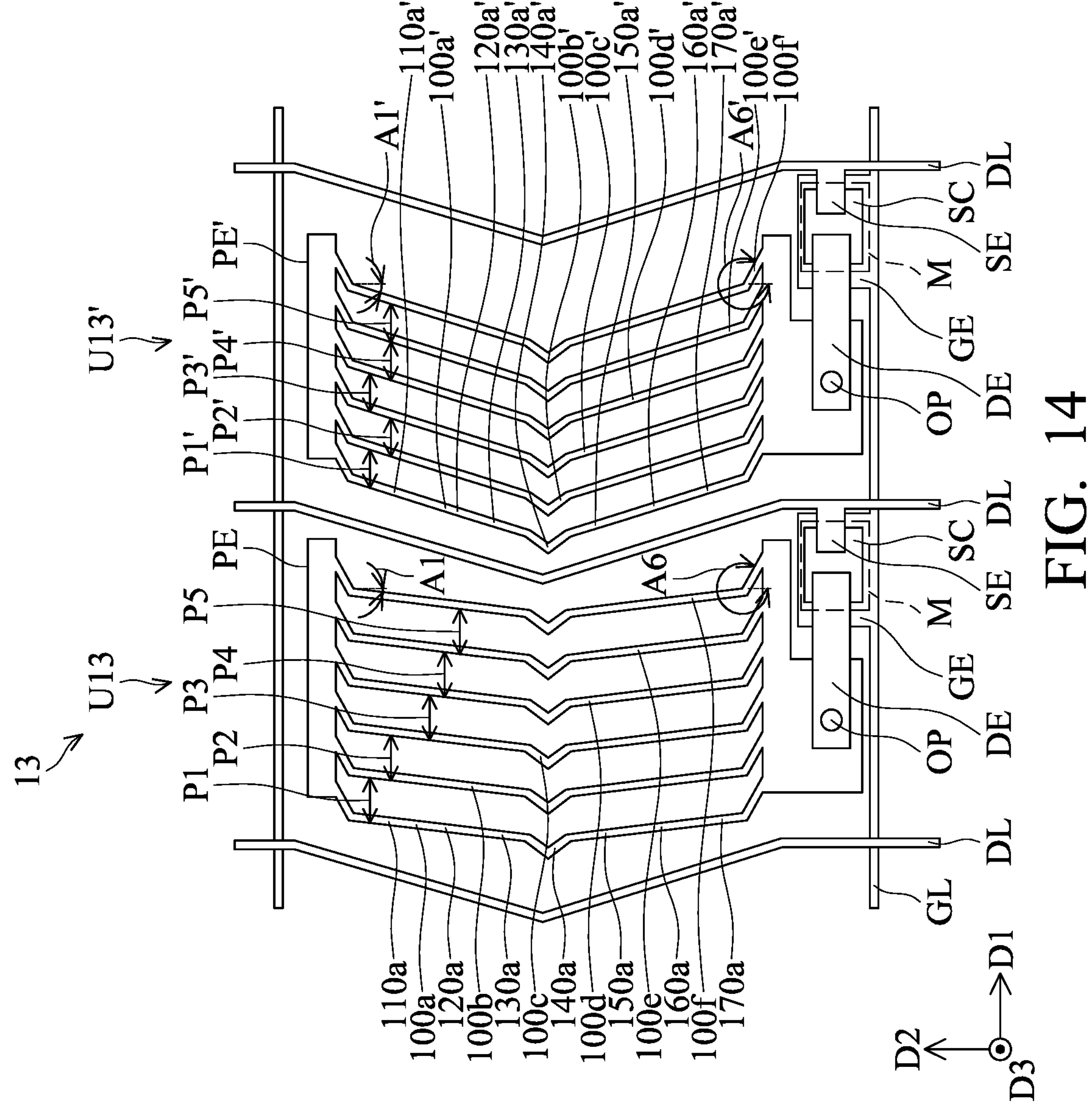
Figure 15:
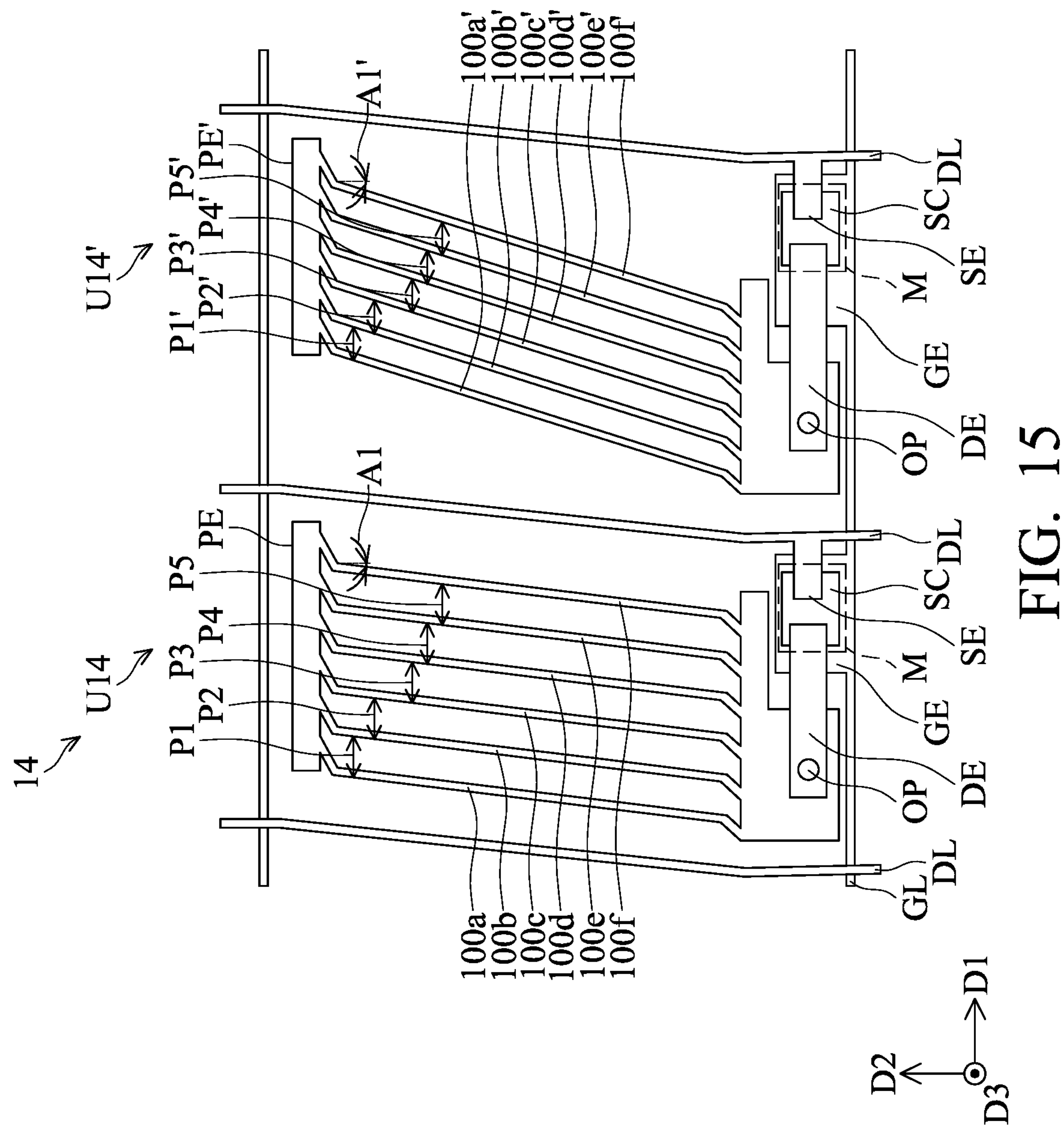

Referring to FIG. 14 and FIG. 15, they show schematic top views of a display device 13 including sub-pixel units U13 and U13' and a display device 14 including sub-pixel units U14 and U14' according to some embodiments of the present disclosure, respectively. It should be noted that, FIG. 14 is similar to FIG. 12. In FIG. 14, the portions of each finger above and below the middle portion may be regarded as a single linear portion, respectively. FIG. 15 is similar to FIG. 13. In FIG. 15, each finger portion of the pixel electrode PE and the pixel electrode PE' may be regarded as a single linear portion, respectively.

As shown in FIGS. 14 and 15, in some embodiments, the first pitch P1 to the fifth pitch P5 in the pixel electrode PE are the same as each other, and the first pitch P1' to the fifth pitch P5' in the pixel electrode PE' are the same as each other, and the first pitch P1 of the pixel electrode PE is different from the first pitch P1' of the pixel electrode PE'. In some embodiments, the difference between the first pitch P1 of the pixel electrode PE and the first pitch P1' of the pixel electrode PE' may be in the range of 0.5 microns to 8 microns (0.5 microns≤the variation of Adjacent pitches≤8 microns). For example, as shown in FIG. 14 and FIG. 15, the first pitch P1 is greater than the first pitch P1', but the present disclosure is not limited thereto. In other embodiments, the first pitch P1 may be smaller than the first pitch P1'. In addition, as shown in FIG. 14 and FIG. 15, the first deviation angle A1 in the pixel electrode PE may be different from the first deviation angle A1' in the pixel electrode PE'. In some other embodiments, the first deviation angle A1 in the pixel electrode PE may be the same as the first deviation angle A1' in the pixel electrode PE'.

To sum up, according to the embodiments of the present disclosure, a display device including a plurality of pixel electrodes is provided, so as to reduce the rainbow-like pattern on the surface of the display panel in the display device by using different structures of the pixel electrodes. For example, by adjusting the height, the deviation angle, and/or the pitch of each finger portion in the pixel electrode, the arrangement of each sub-pixel unit may be disordered, to reduce the interference and the diffraction of external light, thereby weakening the rainbow-like pattern and/or causing the rainbow-like pattern to fade and blur. In addition, the rainbow-like pattern on the surface of the display panel in the display device may be reduced by adjusting the thickness of the pixel electrode.

Components in the disclosed embodiments may be combined arbitrarily as long as they do not violate the spirit of the present disclosure or conflict with each other. In addition, the scope of the present disclosure is not limited to the process, machine, manufacturing, material composition, device, method, and step in the specific embodiments described in the specification. A person of ordinary skill in the art will understand current and future processes, machine, manufacturing, material composition, device, method, and step from the content disclosed in the present disclosure, as long as the current or future processes, machine, manufacturing, material composition, device, method, and step performs substantially the same functions or obtain substantially the same results as the present disclosure. Therefore, the scope of the present disclosure includes the above-mentioned process, machine, manufacturing, material composition, device, method, and steps. Any embodiment or claim of the present disclosure does not need to achieve all the purposes, advantages, and/or features disclosed in the present disclosure.

The foregoing outlines features of several embodiments of the present disclosure, so that a person of ordinary skill in the art may better understand the aspects of the present disclosure. A person of ordinary skill in the art should appreciate that, the present disclosure may be readily used as a basis for designing or modifying other processes and structures for carrying out the same purposes and/or achieving the same advantages of the embodiments introduced herein. A person of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A display device comprising a display panel, wherein the display panel comprises:

a gate line extending along a first direction;

a data line extending along a second direction different from the first direction and crossing the gate line;

a plurality of pixel electrodes, comprising a first pixel electrode and a second pixel electrode adjacently disposed along the first direction, wherein in a top view, a portion of the data line is disposed between the first pixel electrode and the second pixel electrode;

a first transistor electrically connected to the first pixel electrode; and a second transistor electrically connected to the second pixel electrode, wherein the first pixel electrode comprises:

a first finger portion;

a second finger portion; and a third finger portion;

wherein the first finger portion, the second finger portion, and the third finger portion are disposed on the same layer, the second finger portion is disposed between the first finger portion and the third finger portion along the first direction, the third finger portion is closer to the data line than the second finger portion, and a first pitch between the first finger portion and the second finger portion is smaller than a second pitch between the second finger portion and the third finger portion, wherein the second pixel electrode comprises:

a fifth finger portion;

a sixth finger portion; and a seventh finger portion, wherein the fifth finger portion, the sixth finger portion, and the seventh finger portion are disposed on the same layer, the sixth finger portion is disposed between the fifth finger portion and the seventh finger portion along the first direction, and the fifth finger portion is closer to the data line than the sixth finger portion, wherein a fourth pitch between the fifth finger portion and the sixth finger portion is different from the first pitch, wherein the fourth pitch between the fifth finger portion and the sixth finger portion is greater than a fifth pitch between the sixth finger portion and the seventh finger portion.

2. The display device as claimed in claim 1, wherein the first pixel electrode further comprises:

a fourth finger portion;

wherein a third pitch between the third finger portion and the fourth finger portion is the same as the first pitch or the second pitch.

3. The display device as claimed in claim 1, wherein the first pixel electrode further comprises:

a fourth finger portion;

wherein a third pitch between the third finger portion and the fourth finger portion is different from the first pitch and the second pitch.

4. The display device as claimed in claim 1, wherein a variation rate of the first pitch and the second pitch is greater than or equal to 3% and less than or equal to 100%.

5. The display device as claimed in claim 1, wherein the first pitch is sum of an electrode width and a space width, and a ratio of the electrode width to the space width is in the range of 1/19 to 9.

6. The display device as claimed in claim 1, wherein a thickness of the plurality of pixel electrodes is greater than or equal to 75 Å and less than or equal to 700 Å.

7. A display device comprising a display panel, wherein the display panel comprises:

a gate line extending along a first direction;

a data line extending along a second direction different from the first direction and crossing the gate line;

a plurality of pixel electrodes, comprising a first pixel electrode and a second pixel electrode adjacently disposed along the first direction, wherein in a top view, a portion of the data line is disposed between the first pixel electrode and the second pixel electrode;

a first transistor electrically connected to the first pixel electrode, wherein the first transistor comprises a first gate electrode, and the first gate electrode is a portion of the gate line; and a second transistor electrically connected to the second pixel electrode, wherein the second transistor comprises a second gate electrode, and the second gate electrode is another portion of the gate line, wherein the first pixel electrode comprises:

a first finger portion comprising a first linear portion, a second linear portion, and a third linear portion, wherein the second linear portion connects the first linear portion and the third linear portion, and the third linear portion is closer to the gate line than the first linear portion;

wherein the first linear portion has a first deviation angle, the second linear portion has a second deviation angle, the third linear portion has a third deviation angle, and the first deviation angle is smaller than the second deviation angle, the second deviation angle is smaller than the third deviation angle, a second finger portion;

a first connecting portion;

a first crab portion connected between the first finger portion and the first connecting portion, wherein the first finger portion is closer to the gate line than the first crab portion, wherein the first crab portion has a seventh deviation angle, and the seventh deviation angle is greater than the first deviation angle; and a second crab portion connected between the second finger portion and the first connecting portion, wherein the second finger portion is closer to the gate line than the second crab portion, wherein the second pixel electrode comprises:

a third finger portion comprising a fourth linear portion, a fifth linear portion, and a sixth linear portion, wherein the fifth linear portion connects the fourth linear portion and the sixth linear portion, and the sixth linear portion is closer to the gate line than the fourth linear portion;

wherein the fourth linear portion has a fourth deviation angle, the fifth linear portion has a fifth deviation angle, the sixth linear portion has a sixth deviation angle, and the fourth deviation angle is smaller than the fifth deviation angle, the fifth deviation angle is smaller than the sixth deviation angle, and the fourth deviation angle is different from the first deviation angle, a fourth finger portion;

a second connecting portion;

a third crab portion connected between the third finger portion and the second connecting portion, wherein the third finger portion is closer to the gate line than the third crab portion, wherein the third crab portion has an eighth deviation angle, and the eighth deviation angle is greater than the fourth deviation angle; and a fourth crab portion connected between the fourth finger portion and the second connecting portion, wherein the fourth finger portion is closer to the gate line than the fourth crab portion.

8. The display device as claimed in claim 7, wherein an angle difference between the third deviation angle and the second deviation angle is greater than or equal to 0.5 degrees and less than or equal to 30 degrees, and an angle difference between the second deviation angle and the first deviation angle is greater than or equal to 0.5 degrees and less than or equal to 30 degrees.

9. The display device as claimed in claim 7, wherein at least two of the first linear portion, the second linear portion, and the third linear portion have the same height.

10. The display device as claimed in claim 7, wherein the first linear portion, the second linear portion, and the third linear portion have different heights.

11. The display device as claimed in claim 7, wherein a deviation angle of one of the first crab portion to the fourth crab portion is greater than or equal to 30 degrees and less than or equal to 40 degrees.

12. The display device as claimed in claim 7, wherein the first linear portion, the second linear portion, and the third linear portion have a first height ratio, and the fourth linear portion, the fifth linear portion, and the sixth linear portion have a second height ratio, and the first height ratio is different from the second height ratio.

* * * * *